US007425465B2

(12) United States Patent
Birkmeyer (10) Patent No.: US 7,425,465 B2
(45) Date of Patent: Sep. 16, 2008

(54) METHOD OF FABRICATING A MULTI-POST STRUCTURES ON A SUBSTRATE (75) Inventor: Jeffrey Birkmeyer, San Jose, CA (US)

(73) Assignee: FUJIFILM Diamatix, Inc., Lebanon, NH (US)

(*) Notice: Subject to any disclaimer, the term of this patent is extended or adjusted under 35 U.S.C. 154(b) by 201 days.

(21) Appl. No.: 11/383,437

(22) Filed: May 15, 2006

(65) Prior Publication Data

US 2007/0264749 A1    Nov. 15, 2007

(51) Int. Cl.
*H01L 21/00* (2006.01)

(52) U.S. Cl. .................. 438/107; 438/455; 438/712; 438/E21.218

(58) Field of Classification Search .................. None
See application file for complete search history.

(56) References Cited

U.S. PATENT DOCUMENTS

| 5,376,204 | A | 12/1994 | Amano |
| 6,049,308 | A | 4/2000 | Hietala et al. |
| 6,436,853 | B2 | 8/2002 | Lin |
| 6,534,381 | B2 | 3/2003 | Cheung |
| 6,544,863 | B1 | 4/2003 | Chong et al. |
| 6,841,861 | B2 | 1/2005 | Brady |
| 6,984,571 | B1 | 1/2006 | Enquist |
| 2003/0076386 | A1 | 4/2003 | Tamahashi et al. |
| 2003/0081073 | A1 | 5/2003 | Chen et al. |
| 2004/0087109 | A1* | 5/2004 | McCann et al. ............. 438/455 |
| 2005/0161795 | A1* | 7/2005 | Tong et al. .................. 257/686 |
| 2008/0026230 | A1* | 1/2008 | Nevin et al. ................. 428/446 |

FOREIGN PATENT DOCUMENTS

| EP | 1 321 294 A2 | 6/2003 |
| JP | 2004-209724 | 7/2004 |

OTHER PUBLICATIONS

International Search Report and Written Opinion of the International Searching Authority, International Application Serial No. PCT/US07/68990, Nov. 2, 2007, 6 pp.

* cited by examiner

*Primary Examiner*—Alonzo Chambliss
(74) *Attorney, Agent, or Firm*—Fish & Richardson P.C.

(57) ABSTRACT

Micromechanical devices having complex multilayer structures and techniques for forming the devices are described.

18 Claims, 8 Drawing Sheets

METHOD OF FABRICATING A MULTI-POST STRUCTURES ON A SUBSTRATE

BACKGROUND

This invention relates to semiconductor processing of a microelectromechanical structure (MEMS) devices. MEMS devices include a wide range of devices that can serve a number of functions, such as, fluid ejectors, accelerometers, sensors, microphones, filters, light modulators and other such devices. The devices are typically on the scale of a few to many hundreds of micrometers in size. MEMS devices include micromechanical portions that have 3-dimensional features of various geometries, such as, walls, membranes, arms, as well as passages and trenches between the features. Semiconductor processing techniques, such as etching, grinding, polishing, bonding and depositing can be used to form a complex structure with multiple layers having different properties, materials or physical characteristics.

SUMMARY

Micromechanical devices having a complex multilayer structure can be formed using techniques described herein.

In general, in one aspect the invention describes a method of forming a post structure assembly. A first substrate is bonded to a second substrate, wherein the bonding is achieved without a bonding layer. The second substrate is patterned, wherein the patterning leaves a first portion of material of the second substrate and a second portion of material of the second substrate and removes material between the first and second portions of the second substrate, the first potion forming a plurality of structures and the second portion forming an assembly that is a unitary structure having a plurality of apertures therein. The second portion of the second substrate is separated from the first substrate, wherein the second portion does not include the structures.

Implementations of the invention may include one or more of the following features. The two substrates can include silicon. The second substrate can have a thickness and patterning the second substrate can include patterning one or more through-holes that extend through the thickness of the second substrate. The patterning can be done by deep reactive ion etching. Two silicon substrates can be fusion bonded together. The assembly can be annealed so that the first substrate and the structures become permanently bonded together. An annealing step can form an assembly that is substantially free of oxide between the structures and the first substrate. A third substrate can be bonded to top surfaces of the structures. The third substrate can be annealed to the top surfaces of the structures. Bonding the third substrate can include bonding a substrate having one or more apertures or recesses formed therein to the top surfaces of the structures. Patterning the plurality of structures may include patterning a plurality of posts, such as round posts, polygonal shaped posts, hollow posts, or posts with a cross-section having a shape with at least one curved side.

Multiple substrates can be fusion bonded together, such as a first and a second substrate. Fusion bonding can provide a stable, yet impermanent, bond if the silicon substrates are not annealed. The impermanent nature of fusion bonding may allow for forming features in a first substrate, and removing portions of the first substrate prior to making the bond between the features and the base substrate permanent. The first substrate may protect the second substrate during processing. Areas of the second substrate covered by the first substrate may keep etchant from contacting the second substrate during an etching process. When the two substrates are separated, the profile of the second substrate that was covered may be substantially the same in the portions that were covered during the etching process as prior to the etching process.

The details of one or more embodiments of the invention are set forth in the accompanying drawings and the description below.

DESCRIPTION OF DRAWINGS

Like reference symbols in the various drawings indicate like elements.

DETAILED DESCRIPTION

A micromechanical device with a monolithic structure and precisely formed features can be formed using a variety of techniques. Precision in the features can lead to desired behavior of each structure included in the micromechanical device. A variety of micromechanical devices can be formed using the same or similar techniques described below.

Figure 1:
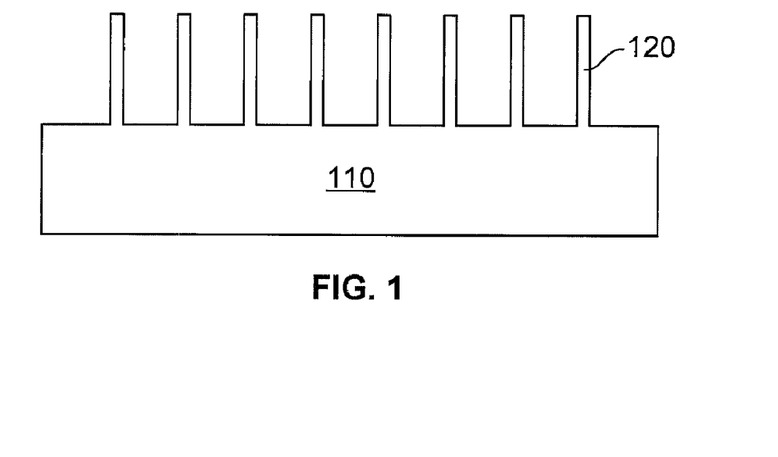
FIG. 1 is a cross-sectional side view of an assembly of a substrate and posts.

Referring to FIG. 1, an assembly of a base substrate 110 with multiple post structures 120 is shown. The post structures 120 and base substrate 110 are formed from a material including silicon, such as elemental silicon, silicon oxide or silicon dioxide. In some implementations, the base substrate 110 and the post structures 120 are formed from pure silicon, that is, a crystalline silicon. The post structures 120 and base substrate 110 can be formed from the same material and can be integrated together, such that virtually no or no layer of material different from the material from which the post structure 120 and base substrate 110 are formed is between the post structures 120 and the base substrate 110. Alternatively, there can be a layer of silicon oxide or silicon dioxide between silicon portions of the assembly. The post structures 120 can be solid, or have a hollow core. The post structures can be of virtually any geometry, such as round, rectangular, or the posts can have virtually any desired cross-sectional shape when viewed from a top of the structure, as described further below.

An individual structure can have a generally uniform cross-sectional dimension as a function of height. Alternatively, a structure can have a shape that varies from a portion that is close to a base substrate 110 as compared to a portion that is further from the base substrate 110, e.g., the structure can be wider at its base than at its top. The structures can have substantially uniform heights.

Figure 2:
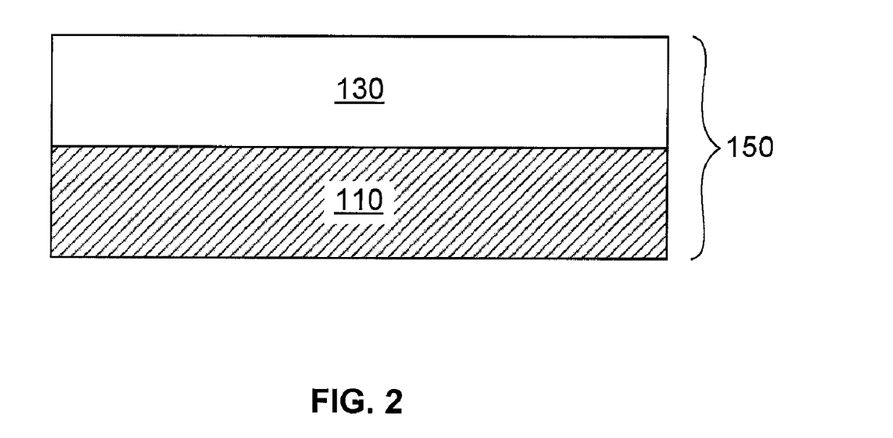
FIG. 2 is a cross-sectional side view of an assembly of two substrates.
Figure 16:
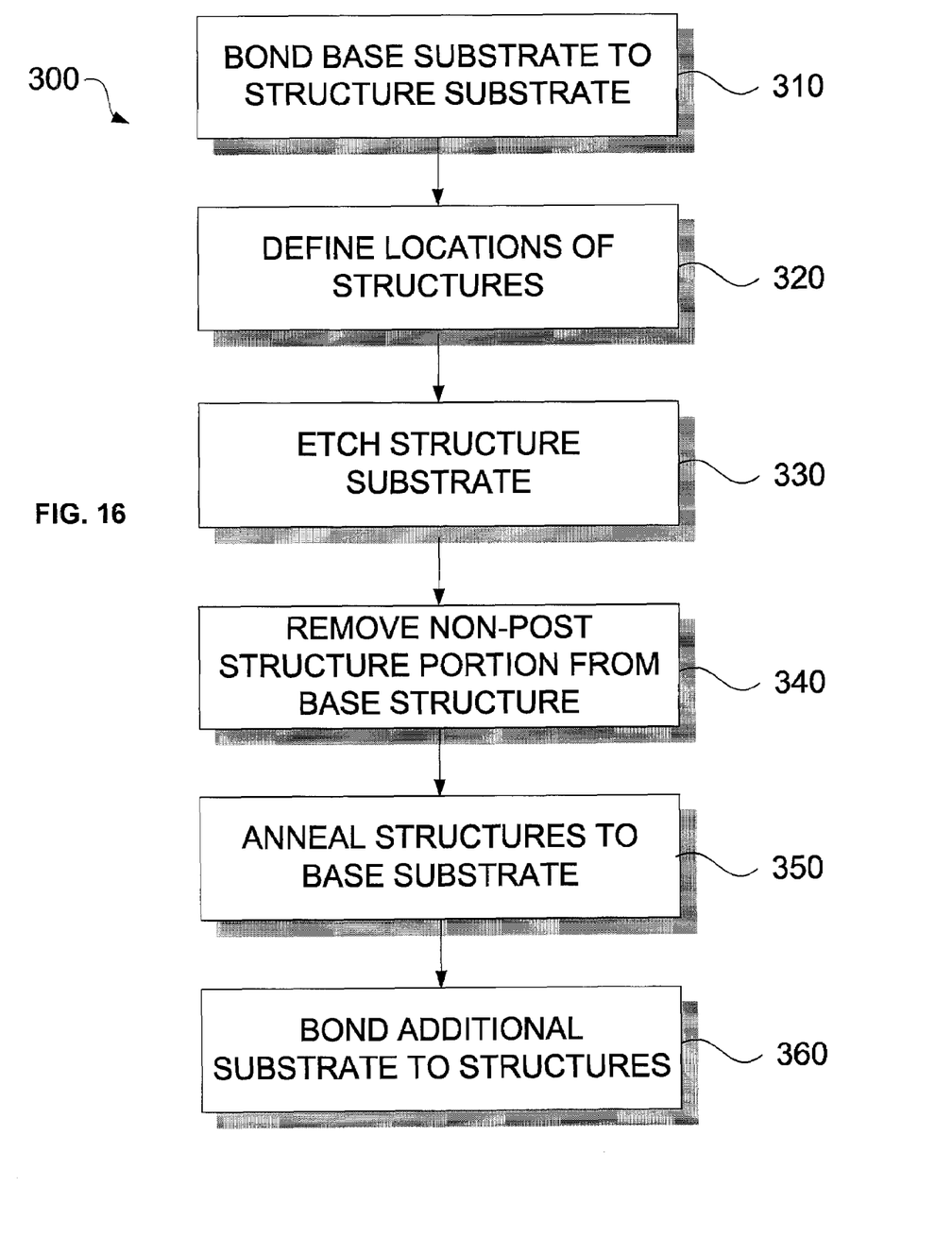
FIG. 16 is a flow describing forming the structure.

Referring to FIGS. 2 and 16, the substrate with post structures is formed as described below (method 300). The base substrate 110 is fusion bonded, or silicon-to-silicon bonded, to a structure substrate 130 (step 310). The substrates 110, 130 can be bonded together, using, for example, a vacuum bonder. Optionally, any oxide layers can be stripped from the substrates prior to bonding if the substrates are silicon substrates. Fusion bonding, which creates Van der Waal's bonds between the two silicon surfaces, can occur when two flat, highly polished, clean silicon surfaces are brought together with no intermediate layer between the two silicon layers. Fusion bonding can also occur between oxide and silicon or between oxide layers. To prepare the two elements for fusion bonding, the base substrate 110 and the structure substrate 130 are both cleaned, such as by RCA cleaning. Other methods, such as hydrophobic substrate treatment, can be used to prepare the substrates for silicon to silicon bonding. Any oxide on the base substrate 110 and the structure substrate 130 can optionally be removed with a buffered hydrofluoric acid etch (BOE). The base substrate 110 and the structure substrate 130 are then brought together to form a substrate assembly 150. The two substrates are bonded together, such that the substrates can be separated, as described further below.

Locations of the structures are defined (step 320). A photoresist, such as a positive photoresist, can be spun onto a front side of the structure substrate 130, such as onto an oxide layer (not shown). The photoresist can be soft baked, and exposed through a chrome mask. The chrome mask has the outline of the desired post locations and geometry. The photoresist is developed and patterned to form a mask defining the locations of the post structures. The area to be etched can be just the area surrounding the post structures. All of the area that is to be removed, that is, all of the portions of the structure substrate 130 that do not form the post structures need not be removed. Thus, the area that is to be removed by etching can be a donut-shaped area around the desired post structure, where the interior of the donut defines the exterior cross-sectional shape of the post structures. Note the interior of the donut is not necessarily circular. The width of the area of the structure substrate 130 that is to be removed only needs be sufficiently wide to separate the post structures 120 from the remainder of the structure substrate 130. Expanding the width of the removed area can facilitate the substrate removal step described below. A larger removed area around each post structure 120 can reduce the likelihood of dislodging a post structure 120 with the structure substrate 130 when the structure substrate 130 is being removed from the base substrate 110. However, not all of the structure substrate 130 will be removed by the etching.

The posts can be formed using an isotropic or an anisotropic etch. Depending on the type of crystal surface structure that is being etched, posts, or other structures, can have vertical walls, tapered walls, or curved walls. For example, etching a <100> surface orientation silicon substrate can form rectangular structures with tapered walls. Isotropically etching a <110> surface orientation silicon substrate can form structures with walls perpendicular to the substrate surface.

Figure 3:
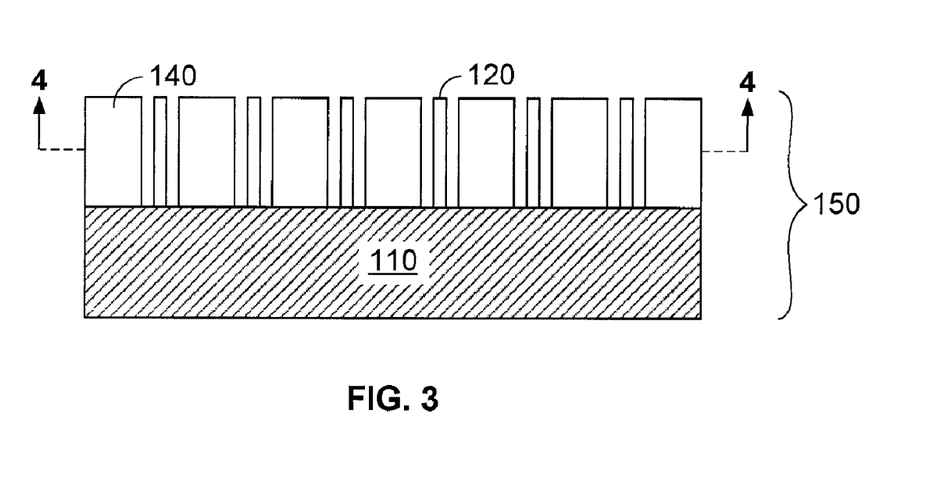
FIG. 3 is a cross-sectional side view of the assembly where one substrate has been etched.

Referring to FIG. 3, the structure substrate 130 is etched (step 330). An oxide substrate, or any native oxide layer on a silicon substrate can be removed or etched by an inductively coupled plasma reactive ion etching (ICP RIE). If the structure substrate 130 is formed of silicon, after any native oxide layer has been removed, the silicon layer is then etched. An example of a silicon etching process is isotropic dry etching by deep reactive ion etching (DRIE), which utilizes plasma to selectively etch silicon to form features with substantially vertical sidewalls. A reactive ion etching technique known as the Bosch process is discussed in Laermor et al. U.S. Pat. No. 5,501,893, the entire contents of which is incorporated hereby by reference. Deep silicon reactive ion etching equipment is available from Surface Technology Systems, Redwood City, Calif., Alcatel, Plano, Tex., or Unaxis, Switzerland, and reactive ion etching can be conducted by etching vendors including Innovative Micro Technology, Santa Barbara, Calif. Deep reactive ion etching is used due to its ability to cut deep features of substantially constant diameter. Etching is performed in a vacuum chamber with plasma and gas, such as $SF_6$ and $C_4F_8$. In one implementation, the back surface of the substrate is cooled. Defects in the substrate can be caused by the heat created during the etching process. A cooling agent, such as helium, can be used to cool the substrate. A metal layer between the silicon substrate and the cooling agent can conduct heat generated by the etching process to the cooling agent efficiently, as well as prevent the cooling agent from escaping into the vacuum chamber and destroying the vacuum.

The structure substrate 130 can be etched using the Bosch DRIE to define the post structures 120. The resist can be stripped from the substrate 120, and the substrate assembly 150 can be piranha cleaned and RCA cleaned.

Figure 4:
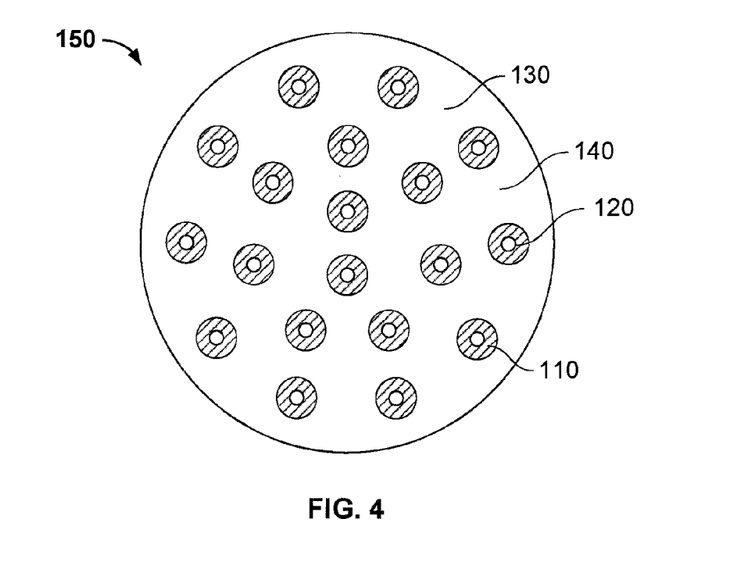
FIG. 4 is a plan view of the substrate assembly.

Referring to FIG. 4, a top view of the substrate assembly 150 shows the post strictures 120 surrounded by a non-post structure portion 140 of the structure substrate 130 after etching. The base substrate 110 can be seen where the etching removed the structure substrate 130 around each post structure 120.

The non-post structure portion 140 of the structure substrate 130 is removed from the base substrate 110 (step 340). Silicon or silicon oxide substrates that have been fusion bonded together, but not annealed, can be separated by gently wedging a separating member between the two substrates. The Van der Waals bonds are sufficiently weak to be broken without damaging the substrate, particularly if the separation is performed sufficiently slowly.

Figure 5:
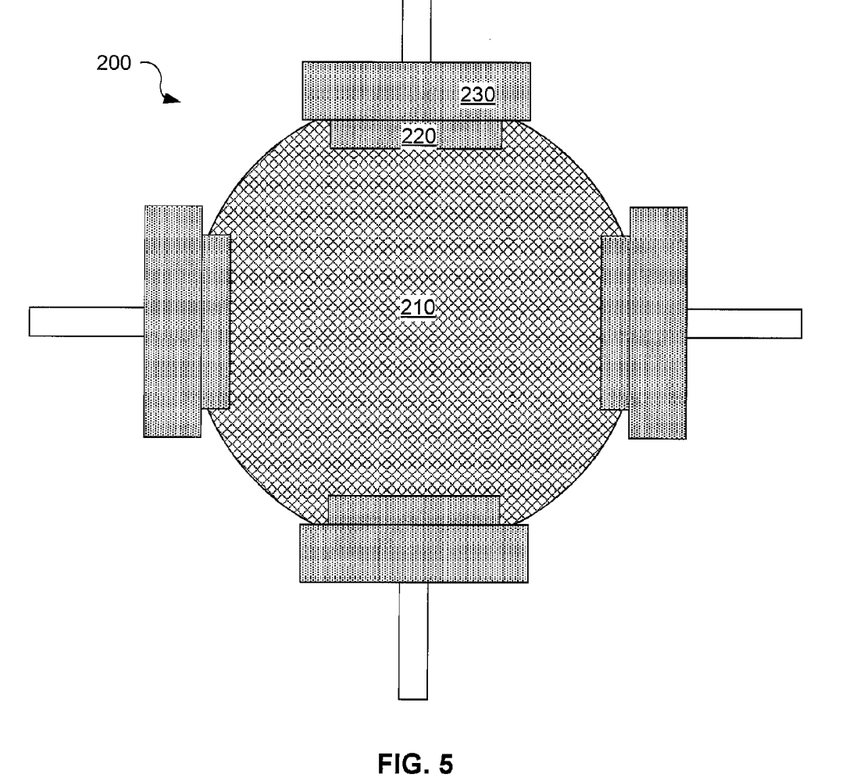
FIG. 5 is a top view of a mechanical bonded-substrate separating device.
Figure 6:
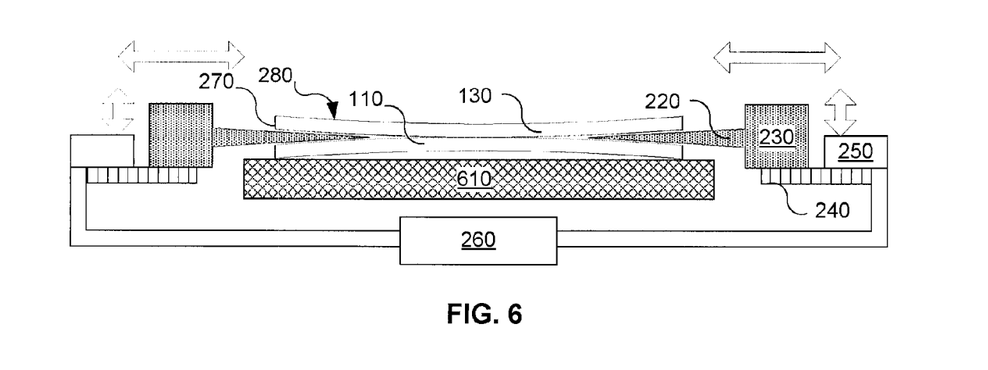
FIG. 6 is a cross-sectional side view of the mechanical bonded-substrate separating device.

Referring to FIGS. 5 and 6, a mechanical device 200 can separate the structure substrate 130 from the base substrate 110, such as one described in U.S. Provisional Application No. 60/621,507, filed on Oct. 21, 2004. The device 200 can include a substrate support 210 that can be actuated up and down. One or more separator units 230 can be used to separate the substrates. If the device includes two or more separator units 230, the units can be spaced at equal angular intervals around the substrate support 210. The separator units 230 can include a separating member 220, e.g., a blade-shaped projection. The separating member 220 can have an edge that is sufficiently thin so that when the separating member 220 applies pressure to the interface between the two substrates, the separating member 220 forces the two substrates apart and can enter between the two substrates. The separating member 220 is formed of a material that is sufficiently stiff that it does not break when applying a pressure sufficient to separate the two substrates. The separating member 220 can have a substantially uniform thickness or it can taper to a thinner edge. In one implementation, the separating member 220 is formed of a thin blade of metal with a sharp leading edge, e.g., a razor blade.

Each separator unit 230 can include a holding member, e.g., a clamp, for securing the separating member 220. The separator units 230 can be independently radially actuated in an inward and outward direction, with respect to a central axis perpendicular to the surface of the substrate support 210. Each separator unit 230 can be actuated by a motor 250 that drives the separator unit along a support rail 240. Each separator unit 230 can also house a sensor to measure the pressure applied by the separating member 220. Each motor 250 and sensor can be connected to a controller 260, e.g., a programmed computer.

To separate the two substrates 110, 130, the controller 260 causes the motor 250 to move the separator units 230 inward. The substrate assembly has a primary face 280 and a thin side 270. The separator units 230 move in a direction perpendicular to the thin side 270 of the bonded substrates and parallel to the primary face 280. The separator units 230 are moved until the sensor detects that the applied pressure exceeds a threshold pressure. When the sensor detects the threshold pressure, the sensor can instruct the motor 250 to stop the inward movement of the separator units 230. As the two substrates 110, 130 begin to peel away from one another the pressure applied by the separator falls. When the sensor detects that the pressure has fallen below the threshold pressure, the controller 260 can instruct the motor 250 to move the separator units 230 inwardly again until the threshold pressure is again detected or until the separator units 230 are moved inward to their furthest extent. For a device having multiple separator units 230, the separator units 230 can be moved in series or together at one time. The separator can be programmed to stop moving inward at a predetermined location to prevent damage to the post structures 120. If the features are located in the center of the substrate, removing the perimeter of the sacrificial substrate is sufficient for substrate separation.

In operation, the two bonded substrates are placed on the substrate support 210. The substrate support 210 can be in an elevated position. In one implementation, the substrates 110, 130 do not contact the substrate support 210 during at least part of the separating process. The separator units 230 are moved in toward the substrates. The separator units 230 can be actuated in an upward or downward direction, or the substrate support 210 can be actuated in an upward or downward direction until the separator members 220 are aligned with the interface between the two substrates 110, 130. The separator units 230 are moved inward until the threshold pressure is sensed. When sensed pressure equals or exceeds the threshold pressure, the inward movement of the separator units 230 is halted. As the substrates begin to separate and the pressure drops below the threshold, the separator members 220 are again urged inward until the pressure reaches the threshold pressure. If the substrate support 210 impedes the inward progress of the separator units 230, the substrate support 210 can be lowered. The process continues until the separator units 230 come to a structure that is not to be separated from the base substrate 110, such as a post structure 120. The separator can be programmed to stop where a post is to be located. Alternatively, a device, such as a lever, or a camera, can detect the when the separating process is to be halted. An infrared camera connected to a monitor can reveal the edge of a bonded area of the substrates 110, 130. The infrared camera reveals the edge of the bonded area of the substrates 110, 130. An operator or the programmed computer can determine the locations of the posts from the camera image and cause the controller to stop the separating process.

Figure 7:
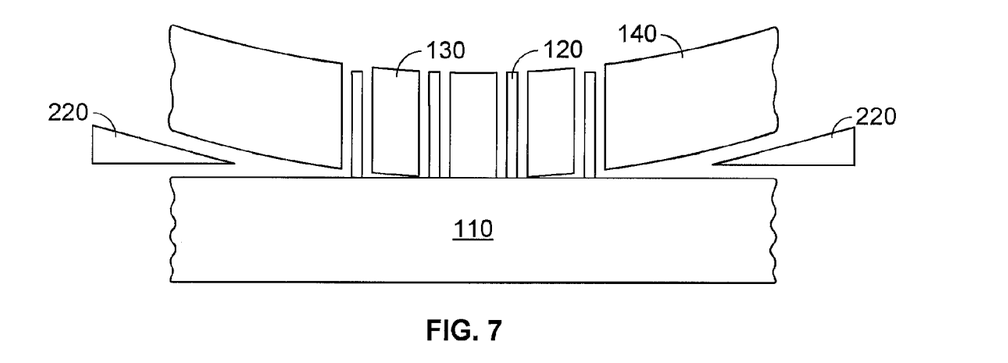
FIG. 7 is a cross-sectional view of two substrates being separated.
Figure 8:
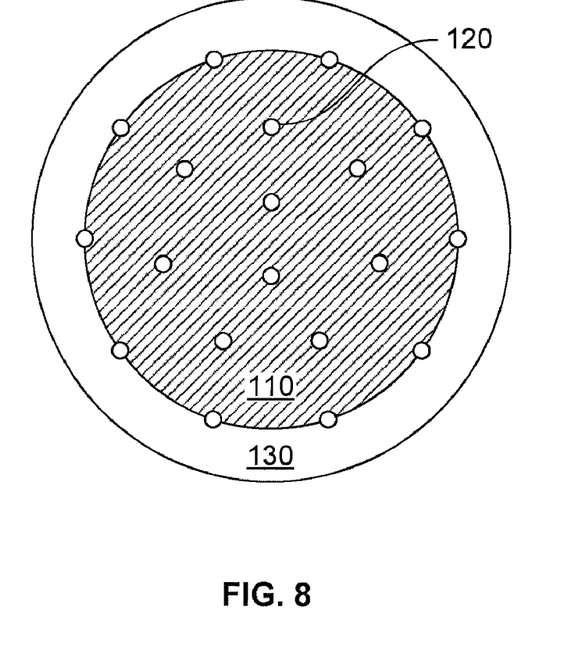
FIG. 8 is a plan view of an etched assembly.

Referring to FIG. 7, a cross-sectional view of the structure substrate 130 being removed from the base substrate 110 shows the separation starting from an outer edge of the substrate and moving toward the center of the substrates. Movement of the separator members 220 is stopped before the separator members 220 reach a post 120. Referring to FIG. 8, in some implementations, the etching step (step 330) removes all of the structure substrate 130 from between the posts, so that no unwanted structure substrate 130 needs to be physically separated from the base substrate 110 in the region between the posts. Some structure substrate 130 may be left behind in a edge region. In some implementations, the substrates are at least partially separated by hand to prevent any posts from being damaged by the separating members 220.

Figure 9:
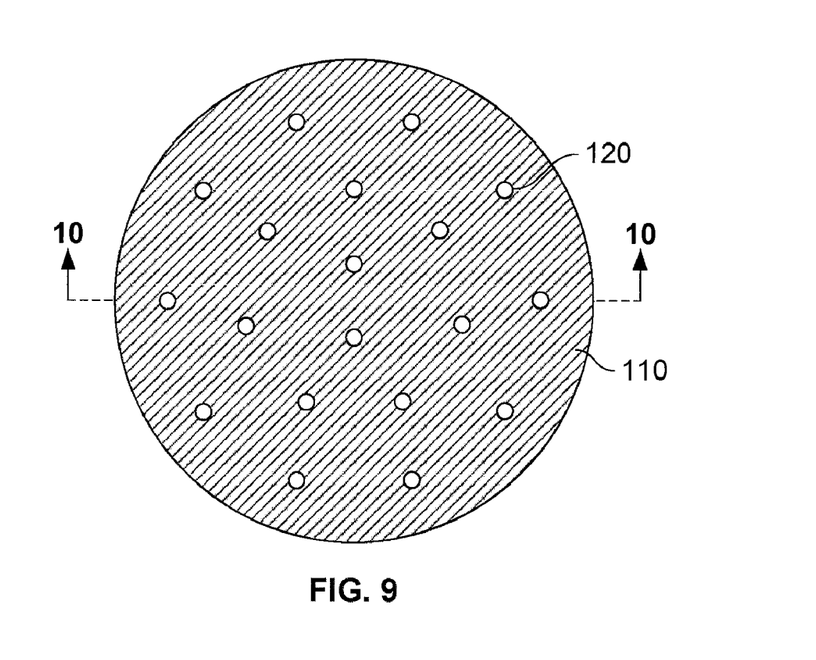
FIG. 9 is a plan view of an etched and separated assembly.
Figure 10:
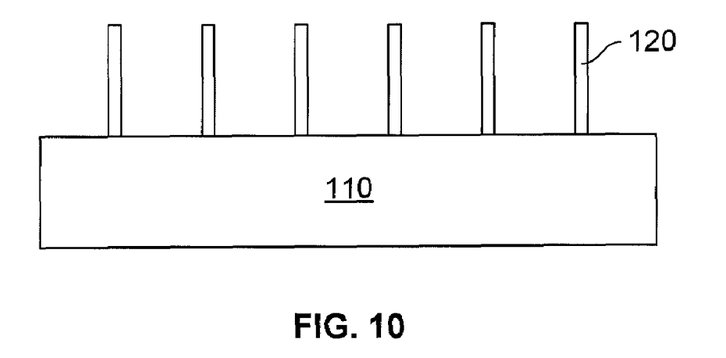
FIGS. 10 and 11 are cross-sectional side views of an assembly of a substrate with posts.

Referring to FIGS. 9 and 10, removing the structure substrate 130 leaves only the post structures 120 remaining on base substrate 110.

Figure 11:
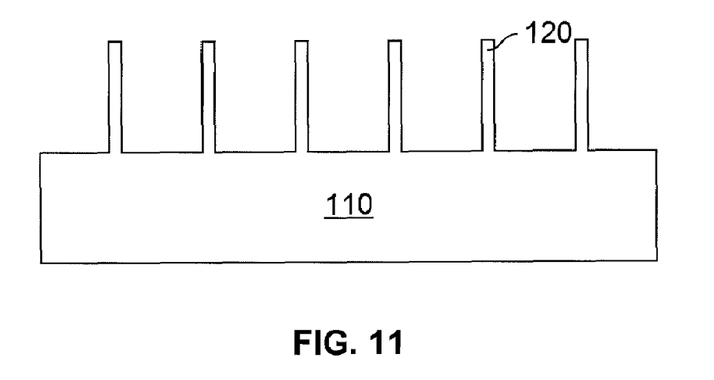

Referring to FIG. 11, the base substrate 110 and post structures 120 can be bonded annealed together to make the fusion bond permanent (step 350). Annealing can be performed at around 1050° C.-1100° C. An advantage of fusion bonding is that no additional layer is formed between the base substrate 110 and the post structures 120. After fusion bonding, the two layers become one unitary layer such that no to virtually no delineation between the two layers exists when bonding is complete. Therefore, if the post structures 120 and the base substrate 110 are formed of silicon, the bonded assembly can be substantially free of an oxide layer inside of the assembly.

Figure 12:
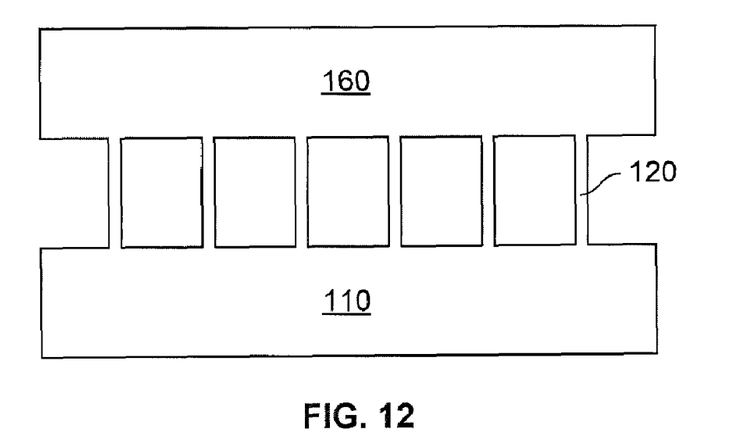
FIGS. 12 and 13 are cross-sectional side views of an assembly of posts between substrates.

Referring to FIG. 12, a third substrate 160 can be fusion bonded to the exposed ends of the post structures 120 (step 360). The third substrate 160 can also be annealed to the top surface of the posts.

Figure 13:
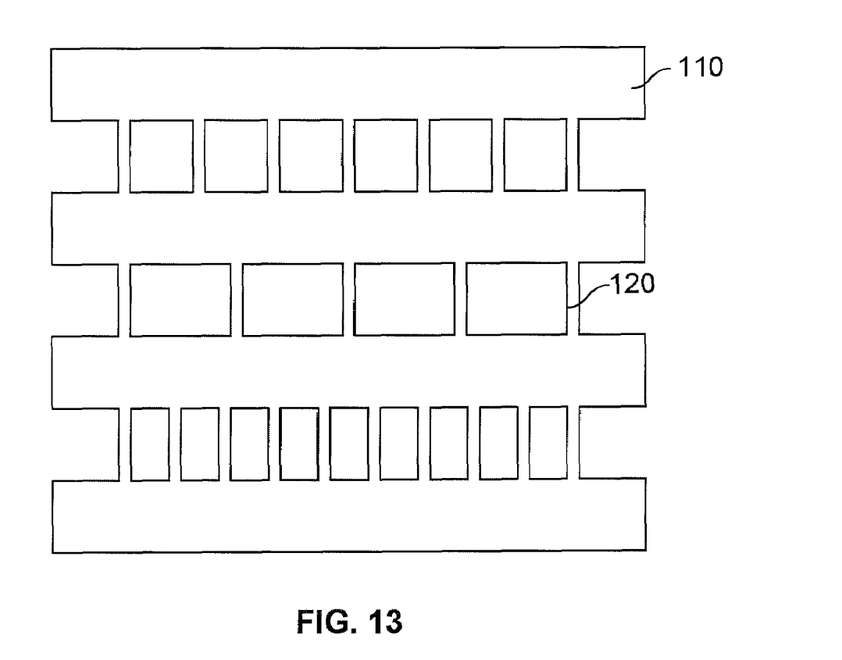
Figure 14:
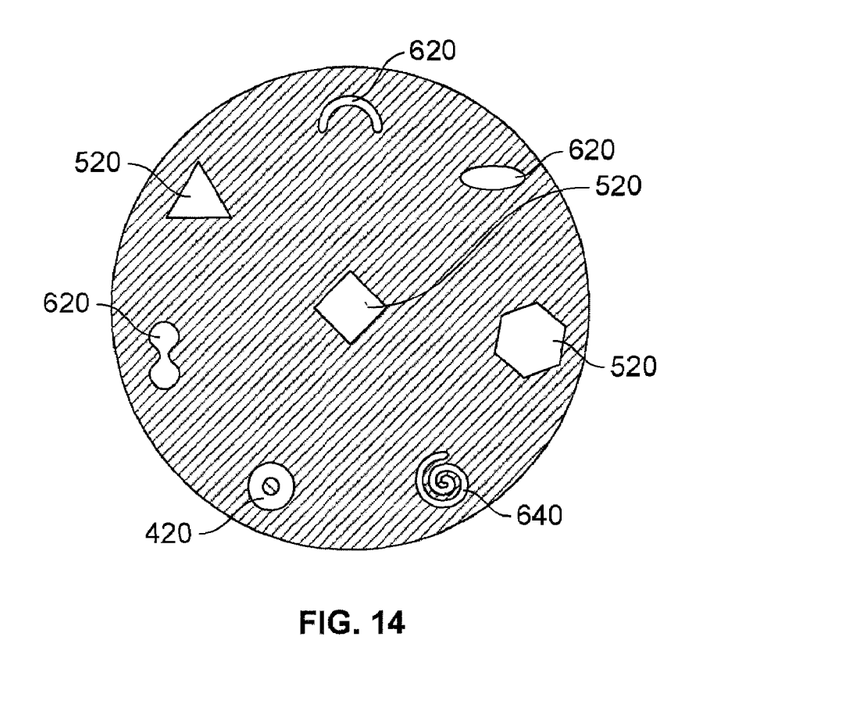
FIG. 14 is a top view of an assembly of a substrate and various post shapes.
Figure 15:
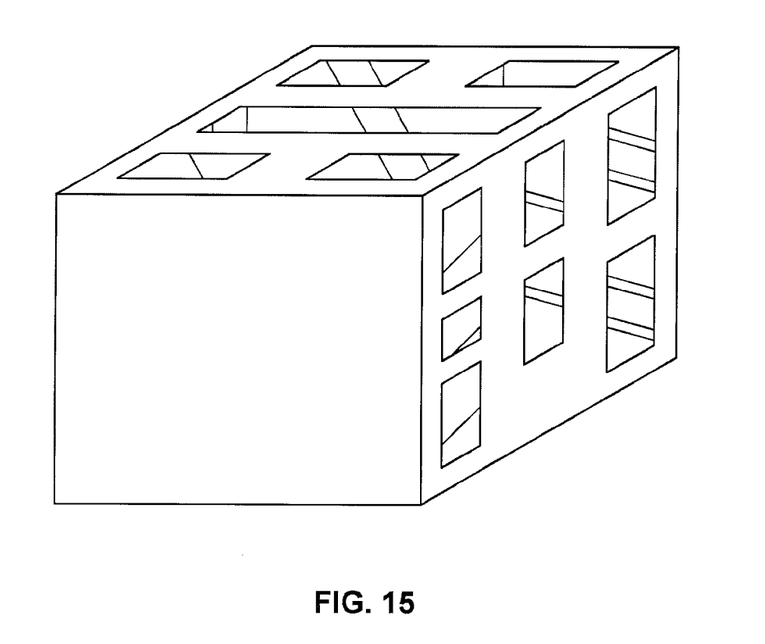
FIG. 15 is a perspective view of 3-dimensional structure with internal layers.

In addition to the post structures, other structures can be formed using the techniques described above. Referring to FIG. 13, multiple layers with post structures located at one or more of the layers can be formed. Referring to FIG. 14, instead of circular posts, spirals 640, rings 420, polygonal shapes 520, or curved shapes 620 can be formed. Referring to FIG. 15, the methods described above allow for complicated 3-dimensional structures to be formed, such as a labyrinth or other complex multilayer structures. Further processing can be performed on the substrate. Heaters, such as polysilicon or metal resistors, can be embedded in the substrate. Sensors, or resistors for metrology can also be embedded in the substrate.

The post structure assembly formed using the methods described above can be used as a filter, such as for fluids. The spacing and geometry of the post structures can be defined by the fluid properties, such as viscosity, required level of filtering, required flow rate of the fluid through the filter, and other factors. The assembly can be used in optics applications. The post structures can have uniform height, that is, each of the structures can have substantially the same height. The post structure assembly can be integrated into a semiconductor structure. Further processing steps can shape or add to the post structure assembly so that the assembly is appropriate for the semiconductor structure.

Forming post structures, or any other type of structure that extends from the surface of a wafer, using the techniques described above can result in a device with one of any number of features. Because the base structure is not being etched, the thickness of the base upon which the post structures are formed can be uniform. Further, the surface of the base substrate can have a very flat profile between the post structures. When etching features into a substrate, the bottom of the etch can be difficult to control and can result in a surface that is not sufficiently planar. With the method described above, at least a portion of the areas between the posts on the structure substrate are not in contact etchant. The structure substrate can protect these areas from being etched. Thus, the profile of these areas of the base substrate can remain substantially the same before and after the etching process.

Bonding substrates together temporarily, processing one of the substrates and separating the substrates can enable the formation of a complex multilayer structure that would be difficult to achieve using a deposition process. A deposition process can require that a support substrate exist under a layer to be deposited. If the support substrate is sandwiched between layers that are desired in the final device, the support substrate must be removable. Removing the temporary layer in a manner that does not adversely affect other portions of the device is not always possible. This methods described above can eliminate the need for a temporary support substrate. Further, 3-dimensional monolithic structures that are formed of a single material without layers of other materials embedded therein can be formed. For example, a structure including three, four, five, six, seven, eight or more layer can be formed using the techniques described herein. One or more of the substrates that are stacked on one another can be processed to add recesses, through holes or structures. Processing a substrate having multiple layers can lead to undesirable effects, such as undercutting at or around an interface of two different materials. These methods can also eliminate these undesirable effects.

A number of embodiments of the invention have been described. Nevertheless, it will be understood that various modifications may be made without departing from the spirit and scope of the invention. For example, the base substrate can be etched prior to being bonded to a structure substrate. Etching the base substrate can form passages between the multiple layers of a device. Additionally, materials other than silicon can be used to form the structures. Accordingly, other embodiments are within the scope of the following claims.

What is claimed is:

1. A method of forming a post structure assembly, comprising:
   bonding a first substrate to a second substrate, wherein the bonding is achieved without a bonding layer;
   patterning the second substrate, wherein the patterning leaves a first portion of material of the second substrate and a second portion of material of the second substrate and removes material between the first and second portions of the second substrate, the first potion forming a plurality of structures and the second portion forming an assembly that is a unitary structure having a plurality of apertures therein; and
   separating the second portion of the second substrate from the first substrate, wherein the second portion does not include the structures.

2. The method of claim 1, wherein bonding the first substrate to the second substrate includes bonding together two substrates that include silicon.

3. The method of claim 2, wherein the second substrate has a thickness and patterning the second substrate includes patterning one or more through-holes that extend through the thickness of the second substrate.

4. The method of claim 2, wherein patterning the second substrate includes deep reactive ion etching.

5. The method of claim 2, wherein bonding the first substrate to the second substrate includes bonding together two silicon substrates.

6. The method of claim 5, wherein bonding together the two silicon substrates includes forming a fusion bond.

7. The method of claim 2, further comprising annealing the assembly so that the first substrate and the structures become permanently bonded together.

8. The method of claim 7, wherein annealing the assembly forms an assembly that is substantially free of oxide between the structures and the first substrate.

9. The method of claim 2, further comprising bonding a third substrate to top surfaces of the structures.

10. The method of claim 9, further comprising annealing the third substrate to the top surfaces of the structures.

11. The method of claim 9, wherein bonding the third substrate includes bonding a substrate having one or more apertures formed therein to the top surfaces of the structures.

12. The method of claim 9, wherein bonding the third substrate includes bonding a substrate having one or more recesses formed therein to the top surfaces of the structures.

13. The method of claim 2, wherein patterning the second substrate to leave the first portion of material that forms the plurality of structures includes patterning the second substrate so that the first portion of material forms a plurality of posts.

14. The method of claim 13, wherein patterning the second substrate to leave the first portion of material that forms the plurality of structures includes the second substrate so that the first portion of material forms patterning a plurality of round posts.

15. The method of claim 13, wherein patterning the second substrate to leave the first portion of material that forms the plurality of structures includes patterning the second substrate so that the first portion of material forms a plurality of conical posts.

16. The method of claim 13, wherein patterning the second substrate to leave the first portion of material that forms the plurality of structures includes patterning the second substrate so that the first portion of material forms a plurality of posts each having a polygonal shape.

17. The method of claim 13, wherein patterning the second substrate to leave the first portion of material that forms the plurality of structures includes patterning the second substrate so that the first portion of material forms a plurality of posts having a cross-section having a shape with at least one curved side.

18. The method of claim 13, wherein patterning the second substrate to leave the first portion of material that forms the plurality of structures includes patterning the second substrate so that the first portion of material forms a plurality of hollow posts.

* * * * *

UNITED STATES PATENT AND TRADEMARK OFFICE
CERTIFICATE OF CORRECTION

PATENT NO.         : 7,425,465 B2  
APPLICATION NO. : 11/383437  
DATED                  : September 16, 2008  
INVENTOR(S)        : Jeffrey Birkmeyer Page 1 of 1

It is certified that error appears in the above-identified patent and that said Letters Patent is hereby corrected as shown below:

On the Cover Page, (73) Assignee, replace;

"FUJIFILM Diamatix, Inc., Lebanon, NH (US)" with
-- FUJIFILM Dimatix, Inc., Lebanon, NH (US) --

Signed and Sealed this

Third Day of February, 2009

JOHN DOLL
*Acting Director of the United States Patent and Trademark Office*